United States Patent [19]
Falster et al.

[11] Patent Number: 5,994,761
[45] Date of Patent: Nov. 30, 1999

[54] IDEAL OXYGEN PRECIPITATING SILICON WAFERS AND OXYGEN OUT-DIFFUSION-LESS PROCESS THEREFOR

[75] Inventors: Robert Falster, Milan; Marco Cornara; Daniela Gambaro, both of Galliate; Massimiliano Olmo, Novara, all of Italy

[73] Assignee: MEMC Electronic Materials SpA, Novara, Italy

[21] Appl. No.: 08/806,436

[22] Filed: Feb. 26, 1997

[51] Int. Cl.$^6$ .................................................. H01L 29/36
[52] U.S. Cl. ............................................ 257/611; 257/913
[58] Field of Search .................................. 257/607–612, 257/913; 438/471–477, 928

[56] References Cited

U.S. PATENT DOCUMENTS

| | | | |
|---|---|---|---|
| 4,314,595 | 2/1982 | Yamamoto et al. | 148/1.5 |
| 4,376,657 | 3/1983 | Nagasawa et al. | 257/610 |
| 5,327,007 | 7/1994 | Imura et al. | 257/610 |
| 5,401,669 | 3/1995 | Falster et al. | 438/471 |
| 5,403,406 | 4/1995 | Falster et al. | 438/471 |
| 5,445,975 | 8/1995 | Gardner et al. | 437/10 |
| 5,502,010 | 3/1996 | Nadahara et al. | 438/471 |
| 5,502,331 | 3/1996 | Inoue et al. | 257/617 |
| 5,534,294 | 7/1996 | Kubota et al. | 427/255 |
| 5,539,245 | 7/1996 | Imura et al. | 257/610 |
| 5,674,756 | 10/1997 | Satoh et al. | 437/10 |
| 5,738,942 | 4/1998 | Kubota et al. | 257/635 |

FOREIGN PATENT DOCUMENTS

| | | |
|---|---|---|
| 0536958 A1 | 4/1993 | European Pat. Off. . |
| 0716168 A1 | 6/1996 | European Pat. Off. . |
| 4323964 A1 | 1/1994 | Germany . |
| 7/321120 | 5/1994 | Japan . |
| 7/335657 | 6/1994 | Japan . |
| 8/045944 | 7/1994 | Japan . |
| 8/45947 | 8/1994 | Japan . |
| 8-45945 | 2/1996 | Japan . |

OTHER PUBLICATIONS

Winkler et al. "Improvement of the Gate Oxide Integrity by Modifying Crystal Pulling and its Impact on Device Failures" J. Electrochem. Soc., vol. 141, No. 5 (1994) pp. 1398–1401.

Zimmerman et al. "Vacancy Concentration Wafer Mapping in Silicon" J. Crystal Growth, vol. 129 (1993) pp. 582–592.

Hara et al., "Enhancement of Oxygen Precipitation in Quenched Czochralski Silicon Crystals" J. Appl. Phys. vol. 66 (1989) pp. 3958–3960.

Handotai et al., "Innovated Silicon Crystal Growth and Wafering Technologies" Electrochemical Society Proceedings vol. 97–3 (1997) pp. 123–133.

Abe et al., "Defect–Free Surfaces of Bulk Wafers by Combination of RTA and Crystal Growth Conditions".

F. Shimura "Semiconductor Silicon Crystal Technology" Academic Press, Inc., San Diego, CA (1989) pp. 360–377.

*Primary Examiner*—David B. Hardy
*Attorney, Agent, or Firm*—Senniger, Powers, Leavitt & Roedel

[57] ABSTRACT

A process for heat-treating a single crystal silicon wafer to influence the precipitation behavior of oxygen in the wafer in a subsequent thermal processing step. The wafer has a front surface, a back surface, a central plane between the front and back surfaces, and a sink for crystal lattice vacancies at the front surface. In the process, the wafer is subjected to a heat-treatment to form crystal lattice vacancies, the vacancies being formed in the bulk of the silicon. The wafer is then cooled from the temperature of said heat treatment at a rate which allows some, but not all, of the crystal lattice vacancies to diffuse to the crystal lattice vacancy sink to produce a wafer having a vacancy concentration profile in which the peak density is at or near the central plane with the concentration generally decreasing in the direction of the front surface of the wafer.

67 Claims, 9 Drawing Sheets

IDEAL OXYGEN PRECIPITATING SILICON WAFERS AND OXYGEN OUT-DIFFUSION-LESS PROCESS THEREFOR

BACKGROUND OF THE INVENTION

The present invention generally relates to the preparation of semiconductor material substrates, especially silicon wafers, which are used in the manufacture of electronic components. More particularly, the present invention relates to a process for the treatment of silicon wafers which enables the wafers, during the heat treatment cycles of essentially any arbitrary electronic device manufacturing process to form an ideal, non-uniform depth distribution of oxygen precipitates.

Single crystal silicon, which is the starting material for most processes for the fabrication of semiconductor electronic components, is commonly prepared with the so-called Czochralski process wherein a single seed crystal is immersed into molten silicon and then grown by slow extraction. As molten silicon is contained in a quartz crucible, it is contaminated with various impurities, among which is mainly oxygen. At the temperature of the silicon molten mass, oxygen comes into the crystal lattice until it reaches a concentration determined by the solubility of oxygen in silicon at the temperature of the molten mass and by the actual segregation coefficient of oxygen in solidified silicon. Such concentrations are greater than the solubility of oxygen in solid silicon at the temperatures typical for the processes for the fabrication of electronic devices. As the crystal grows from the molten mass and cools, therefore, the solubility of oxygen in it decreases rapidly, whereby in the resulting slices or wafers, oxygen is present in supersaturated concentrations.

Thermal treatment cycles which are typically employed in the fabrication of electronic devices can cause the precipitation of oxygen in silicon wafers which are supersaturated in oxygen. Depending upon their location in the wafer, the precipitates can be harmful or beneficial. Oxygen precipitates located in the active device region of the wafer can impair the operation of the device. Oxygen precipitates located in the bulk of the wafer, however, are capable of trapping undesired metal impurities that may come into contact with the wafer. The use of oxygen precipitates located in the bulk of the wafer to trap metals is commonly referred to as internal or intrinsic gettering ("IG").

Historically, electronic device fabrication processes included a series of steps which were designed to produce silicon having a zone or region near the surface of the wafer which is free of oxygen precipitates (commonly referred to as a "denuded zone" or a "precipitate free zone") with the balance of the wafer, i.e., the wafer bulk, containing a sufficient number of oxygen precipitates for IG purposes. Denuded zones can be formed, for example, in a high-low-high thermal sequence such as (a) oxygen out-diffusion heat treatment at a high temperature (>1100° C.) in an inert ambient for a period of at least about 4 hours, (b) oxygen precipitate nuclei formation at a low temperature (600–750° C.), and (c) growth of oxygen (SiO$_2$) precipitates at a high temperature (1000–1150° C.). See, e.g., F. Shimura, *Semiconductor Silicon Crystal Technology*, Academic Press, Inc., San Diego Calif. (1989) at pages 361–367 and the references cited therein.

More recently, however, advanced electronic device manufacturing processes such as DRAM manufacturing processes have begun to minimize the use of high temperature process steps. Although some of these processes retain enough of the high temperature process steps to produce a denuded zone and sufficient density of bulk precipitates, the tolerances on the material are too tight to render it a commercially viable product. Other current highly advanced electronic device manufacturing processes contain no out-diffusion steps at all. Because of the problems associated with oxygen precipitates in the active device region, therefore, these electronic device fabricators must use silicon wafers which are incapable of forming oxygen precipitates anywhere in the wafer under their process conditions. As a result, all IG potential is lost.

SUMMARY OF THE INVENTION

Among the objects of the invention, therefore, is the provision of a single crystal silicon wafer which, during the heat treatment cycles of essentially any electronic device manufacturing process, will form an ideal, non-uniform depth distribution of oxygen precipitates; the provision of such a wafer which will optimally and reproducibly form a denuded zone of sufficient depth and a sufficient density of oxygen precipitates in the wafer bulk; the provision of such a wafer in which the formation of the denuded zone and the formation of the oxygen precipitates in the wafer bulk is not dependant upon differences in oxygen concentration in these regions of the wafer; the provision of such a process in which the formation of the denuded zone does not depend upon the out-diffusion of oxygen; the provision of such a wafer in which the thickness of the resulting denuded zone is essentially independent of the details of the IC manufacturing process sequence; and the provision of such a wafer in which the formation of the denuded zone and the formation of the oxygen precipitates in the wafer bulk is not influenced by the thermal history and the oxygen concentration of the Czochralski-grown, single crystal silicon ingot from which the silicon wafer is sliced.

Briefly, therefore, the present invention is directed to a Cz single crystal silicon wafer having a front surface, a back surface, a central plane between the front and back surfaces, a front surface layer which comprises the region of the wafer between the front surface and a distance, $D_1$, measured from the front surface and toward the central plane, and a bulk layer which comprises the region of the wafer between the central plane and the distance, $D_1$, measured from the front surface of the wafer. In addition, the wafer has a non-uniform distribution of crystal lattice vacancies (one type of intrinsic point defect which forms in single crystal silicon) with the concentration of vacancies in the bulk layer being greater than the concentration of vacancies in the front surface layer with the difference in concentration being such that upon being subjected to the heat treatment cycles of essentially any electronic device manufacturing process, the wafer will form a denuded zone in the front surface layer and have a sufficient density of oxygen precipitates for IG purposes in the bulk layer.

The present invention is also directed to a wafer having a front surface, a back surface, and a central plane between the front and back surfaces, the wafer having a front surface layer consisting of the region of the wafer within a distance, $D_2$, of the front surface wherein $D_2$ is no more than about 15 micrometers, a bulk layer comprising the region of the wafer between the central plane the front surface layer, and a denuded zone which comprises the front surface layer and a portion of the bulk layer. The wafer is characterized in that it has a substantially uniform oxygen concentration in the bulk layer, oxygen precipitates in the portion of the bulk layer which is outside the denuded zone, and a substantial absence of oxygen precipitates in the denuded zone.

The present invention is further directed to a process for heat-treating a Cz, single crystal silicon wafer to influence the precipitation behavior of oxygen in the wafer in a subsequent thermal processing step. The wafer has a front surface, a back surface, a central plane between the front and back surfaces, a vacancy sink at the front surface, a front surface layer which comprises the region of the wafer between the front surface and a distance, $D_1$, measured from the front surface and toward the central plane, and a bulk layer which comprises the region of the wafer between the central plane and the distance, $D_1$, measured from the front surface of the wafer. In the process, the wafer is subjected to a heat-treatment to form crystal lattice vacancies throughout the wafer. The concentration of vacancies in the heat-treated wafer is then reduced by controlling the cooling rate of the heat-treated wafer to produce a wafer having a vacancy concentration profile in which the peak density is at or near the central plane with the concentration generally decreasing in the direction of the front surface of the wafer. The difference in the concentration of vacancies in the front surface layer and the bulk layer is such that a thermal treatment of the wafer at a temperature in excess of 750° C. will lead to the formation of a denuded zone in the front surface layer and oxygen clusters or precipitates in the bulk zone with the concentration of the oxygen clusters or precipitates being primarily dependant upon the concentration of vacancies in the bulk layer.

Other objects and features of this invention will be in part apparent and in part pointed out hereinafter.

DETAILED DESCRIPTION OF THE PREFERRED EMBODIMENTS

Figure 1:
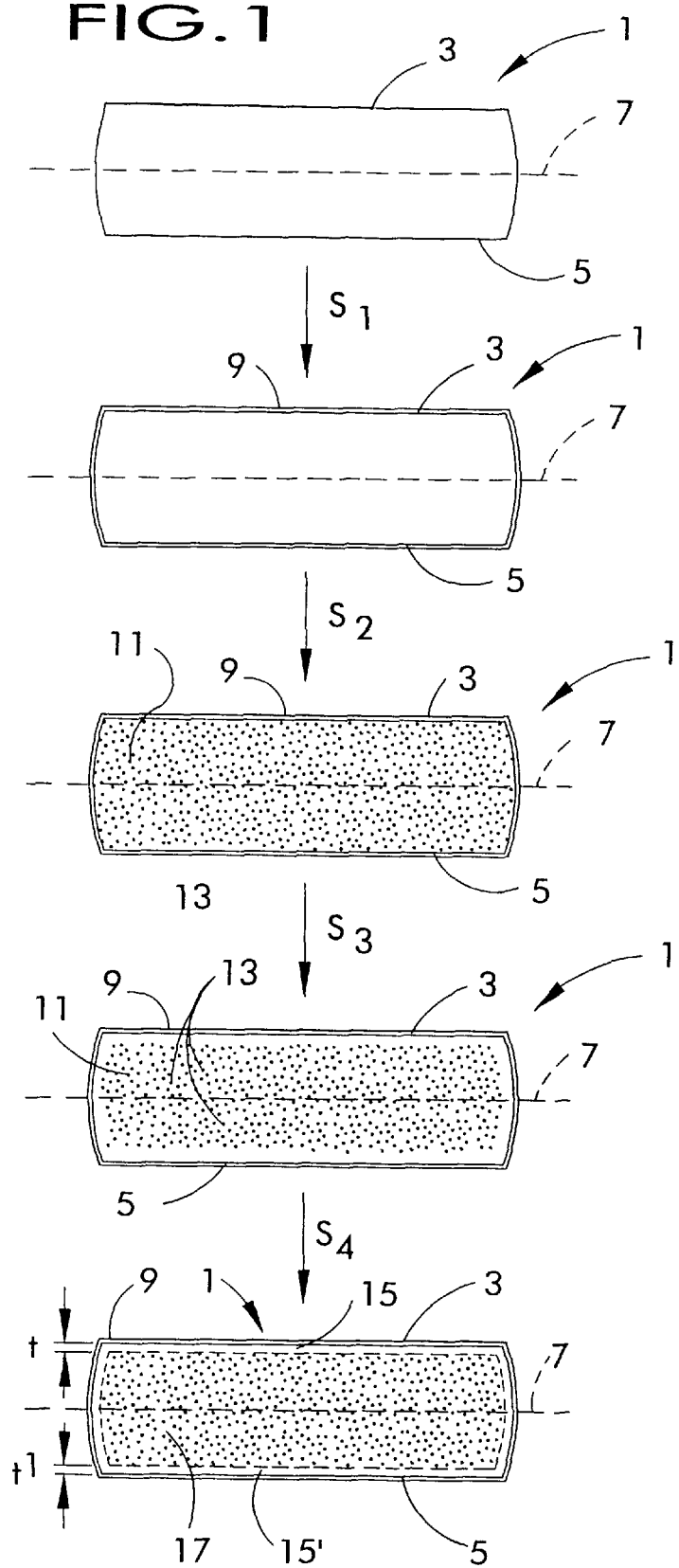
FIG. 1 is a schematic depiction of the process of the present invention.

In accordance with the present invention, an ideal precipitating wafer has been discovered which, during essentially any electronic device manufacturing process, will form a denuded zone of sufficient depth and a wafer bulk containing a sufficient density of oxygen precipitates for IG purposes. Advantageously, this ideal precipitating wafer may be prepared in a matter of minutes using tools which are in common use in the semiconductor silicon manufacturing industry. This process creates a "template" in the silicon which determines or "prints" the manner in which oxygen will precipitate during the electronic device manufacturing process.

The starting material for the ideal precipitating wafers of the present invention is a single crystal silicon wafer which has been sliced from a single crystal ingot grown in accordance with conventional Czochralski crystal growing methods. Such methods, as well as standard silicon slicing, lapping, etching, and polishing techniques are disclosed, for example, in F. Shimura, *Semiconductor Silicon Crystal Technology*, Academic Press, 1989, and *Silicon Chemical Etching*, (J. Grabmaier ed.) Springer-Verlag, New York, 1982 (incorporated herein by reference).

Czochralski-grown silicon typically has an oxygen concentration within the range of about $5 \times 10^{17}$ to about $9 \times 10^{17}$ atoms/cm$^3$ (ASTM standard F-121-83). Because the oxygen precipitation behavior of the wafer becomes essentially decoupled from the oxygen concentration in the ideal precipitating wafer, the starting wafer may advantageously have an oxygen concentration falling anywhere within the range attainable by the Czochralski process.

Depending upon the cooling rate of the single crystal silicon ingot from the temperature of the melting point of silicon (about 1410° C.) through the range of about 750° C. to about 350° C., oxygen precipitate nucleation centers may form in the single crystal silicon ingot from which the wafer is sliced. The presence or absence of these nucleation centers in the starting material is not critical to the present invention provided, however, these centers are capable of being dissolved by heat-treating the silicon at temperatures not in excess of about 1300° C. Certain heat-treatments, such as annealing the silicon at a temperature of about 800° C. for about four hours, can stabilize these centers such that they are incapable of being dissolved at temperatures not in excess of about 1150° C. The detection limit for oxygen precipitates is currently about $5 \times 10^6$ precipitates/cm$^3$. The presence (or density) of oxygen precipitation nucleation centers cannot be directly measured using presently available techniques. As previously discussed, preexisting oxygen precipitate nucleation centers in the silicon can be stabilized and precipitates can be grown at these sites by subjecting the silicon to an oxygen precipitation heat treatment. Thus, the presence of these nucleation centers can indirectly be measured after an oxygen precipitation heat treatment, e.g., annealing the wafer at a temperature of 800° C. for four hours and then at a temperature of 1000° C. for sixteen hours in an oxygen containing atmosphere.

Substitutional carbon, when present as an impurity in single crystal silicon has the ability to catalyze the formation of oxygen precipitate nucleation centers. For this and other reasons, therefore, it is preferred that the single crystal silicon starting material have a low concentration of carbon. That is, the single crystal silicon should have a concentration of carbon which is less than about $5 \times 10^{16}$ atoms/cm$^3$, preferably which is less than $1 \times 10^{16}$ atoms/cm$^3$, and more preferably less than $5 \times 10^{15}$ atoms/cm$^3$.

Referring now to FIG. 1, the starting material for the ideal precipitating wafer of the present invention, single crystal silicon wafer 1, has a front surface 3, a back surface 5, and an imaginary central plane 7 between the front and back surfaces. The terms "front" and "back" in this context are used to distinguish the two major, generally planar surfaces of the wafer; the front surface of the wafer as that term is used herein is not necessarily the surface onto which an electronic device will subsequently be fabricated nor is the back surface of the wafer as that term is used herein necessarily the major surface of the wafer which is opposite the surface onto which the electronic device is fabricated. In addition, because silicon wafers typically have some total thickness variation, warp and bow, the midpoint between every point on the front surface and every point on the back surface may not precisely fall within a plane; as a practical matter, however, the TTV, warp and bow are typically so slight that to a close approximation the midpoints can be said to fall within an imaginary central plane which is approximately equidistant between the front and back surfaces.

In a first embodiment of the process of the present invention the surface of wafer 1 is modified in step $S_1$ to create a sink for crystal lattice vacancies. Preferably, the surface is modified by forming a superficial oxide layer 9 which envelopes wafer 1. Experimental evidence obtained to-date suggests that oxide layers having a thickness of at least about 30 Angstroms effectively serve as a sink for crystal lattice vacancies for those applications considered to-date and that little or no additional benefit would be obtained for these applications by increasing the thickness of the oxide layer, for example, to 50 Ångstroms or more. Experimental evidence obtained to-date further suggests that the oxide layer thickness should preferably be greater than the thickness of a native oxide layer (the silicon dioxide layer which naturally forms on silicon when silicon is exposed to ambient air and which typically has a thickness of about 15 Ångstroms). In general, therefore, the sink for crystal lattice vacancies is formed by growing an oxide layer on the surface of the wafer to a thickness which is greater than the thickness of a native oxide layer and, depending upon the application, to a thickness of least about 20 Ångstroms, at least about 25 Ångstroms, or even at least about 30 Ångstroms. Superficial oxide layers having these thicknesses may be obtained, for example, by annealing the wafer at an elevated temperature in an oxygen containing atmosphere.

In step $S_2$, the wafer is subjected to a heat-treatment step in which the wafers are heated to an elevated temperature to form and thereby increase the number density of crystal lattice vacancies 13 in wafer 1. Preferably, this heat-treatment step is carried out in a rapid thermal annealer in which the wafers are rapidly heated to a target temperature and annealed at that temperature for a relatively short period of time. In general, the wafer is subjected to a temperature in excess of 1150° C., preferably at least 1175° C., more preferably at least about 1200° C., and most preferably between about 1200° C. and 1275° C.

In the first embodiment of the present invention, the rapid thermal annealing step is carried out in the presence of a nitriding atmosphere, that is, an atmosphere containing nitrogen gas ($N_2$) or a nitrogen-containing compound gas such as ammonia. An increase in vacancy concentration throughout the wafer is achieved nearly, if not immediately, upon achieving the annealing temperature; annealing the wafer at this temperature in the nitriding atmosphere will further increase the vacancy concentration. Thus, the wafer will generally be maintained at this temperature for at least one second, typically for at least several seconds (e.g., at least 3) or even several tens of seconds of seconds and, depending upon the desired characteristics of the wafer and the atmosphere in which the wafer is being annealed, for a period which may range up to about 60 seconds (which is near the limit for commercially available rapid thermal annealers).

In general, annealing the wafer in a rapid thermal annealer in the presence of a nitriding atmosphere produces a non-uniform vacancy concentration (number density) profile in the wafer with the peak concentration occurring within about 50 to 100 micrometers of the surface which is exposed to the nitriding gas and a lesser and relatively uniform concentration in the wafer bulk. If the front and back surfaces of the wafer are exposed to the nitriding atmosphere during the rapid thermal annealing step, therefore, the resulting wafer will have a vacancy concentration (number density) profile which is generally "U-shaped" for a cross-section of the wafer, that is, a maximum concentration will occur within several micrometers of each of the front and back surfaces and a relatively constant and lesser concentration will occur throughout the wafer bulk.

Experimental evidence obtained to-date suggests that the atmosphere in which the rapid thermal annealing step is carried out should have an essential absence of oxygen in order for the build-up of vacancies to occur. That is, the atmosphere should have a total absence of oxygen or a partial pressure of oxygen which is insufficient to inject sufficient quantities of silicon self-interstitial atoms which suppress the build-up of vacancy concentrations. While the lower limit of oxygen concentration has not been precisely determined, it has been demonstrated that for partial pressures of oxygen of 0.1 atmospheres, no increase in vacancy concentration is observed. Thus, it is preferred that the atmosphere have a partial pressure of oxygen of less than 0.1 atm, more preferably less than 0.05 atm., and most preferably less than 0.001 atm.

In addition to causing the formation of crystal lattice vacancies, the rapid thermal annealing step causes the dissolution of any unstabilized oxygen precipitate nucleation centers which are present in the silicon starting material. These nucleation centers may be formed, for example, during the growth of the single crystal silicon ingot from which the wafer was sliced or as a consequence of some other event in the previous thermal history of the wafer or of the ingot from which the wafer is sliced. Thus, the presence or absence of these nucleation centers in the starting material is not critical, provided these centers are capable of being dissolved during the rapid thermal annealing step.

The rapid thermal anneal may be carried out in any of a number of commercially available rapid thermal annealing ("RTA") furnaces in which wafers are individually heated by banks of high power lamps. RTA furnaces are capable of rapidly heating a silicon wafer, e.g., they are capable of heating a wafer from room temperature to 1200° C. in a few seconds. One such commercially available RTA furnace is the model 610 furnace available from AG Associates (Mountain View, Calif.).

Crystal lattice vacancies, like metals and other elements, are capable of diffusing through single crystal silicon with the rate of diffusion being temperature dependent. For example, crystal lattice vacancies are relatively mobile at temperatures in the vicinity of the temperature at which the wafer is annealed in the rapid thermal annealing step whereas they are essentially immobile for any commercially practical time period at temperatures of as much as 700° C. Experimental evidence obtained to-date suggests that the diffusion rate of vacancies slows considerably at temperatures less than about 700° C. and perhaps as great as 800° C., 900° C., or even 1,000° C., the vacancies can be considered to be immobile for any commercially practical time period.

Upon completion of step $S_2$, the wafer is rapidly cooled in step $S_3$ through the range of temperatures at which crystal lattice vacancies are relatively mobile in the single crystal silicon. As the temperature of the wafer is decreased through this range of temperatures, the vacancies diffuse to the oxide layer 9 and become annihilated, thus leading to a change in the vacancy concentration profile with the extent of change depending upon the length of time the wafer is maintained at a temperature within this range. If the wafer were held at this temperature within this range for an infinite period of time, the vacancy concentration would once again become substantially uniform throughout wafer bulk 11 with the concentration being an equilibrium value which is substantially less than the concentration of crystal lattice vacancies immediately upon completion of the heat treatment step. By rapidly cooling the wafer, however, a non-uniform distribution of crystal lattice vacancies can be achieved with the maximum vacancy concentration being at or near central plane 7 and the vacancy concentration decreasing in the direction of the front surface 3 and back surface 5 of the wafer. In general, the average cooling rate within this range of temperatures is at least about 5° C. per second, preferably at least about 20° C. per second, more preferably at least about 50° C. per second, still more preferably at least about 100° C. per second, with cooling rates in the range of about 100° C. to about 200° C. per second being presently most preferred. Once the wafer is cooled to a temperature outside the range of temperatures at which crystal lattice vacancies are relatively mobile in the single crystal silicon, the cooling rate does not appear to significantly influence the precipitating characteristics of the wafer and thus, does not appear to be narrowly critical.

Conveniently, the cooling step may be carried out in the same atmosphere in which the heating step is carried out. Alternatively, the wafer may be cooled in an oxygen containing atmosphere.

After the wafer has been cooled, it is ready for use in an electronic device manufacturing process. Typically, in one of the first steps of such process wafers are loaded into a furnace which is at a temperature of about 800° C. When loaded into a furnace at this temperature, the previously cooled wafer will have separate zones which behave differently with respect to oxygen precipitation. In the high vacancy regions (the wafer bulk), oxygen clusters rapidly as the wafer enters the furnace. By the time the loading temperature is reached, the clustering process is finished and a distribution of clusters is reached which depends only upon the initial concentration of vacancies. In the low vacancy regions (near the wafer surfaces), the wafer behaves like a normal wafer which lacks pre-existing oxygen precipitate nucleation centers; that is, oxygen clustering is not observed. As the temperature is increased above 800° C. or if the temperature remains constant, the clusters in the vacancy rich zone grow into precipitates and are thereby consumed whereas in the vacancy lean zone, nothing happens. By dividing the wafer into various zones of vacancy concentration, a template is effectively created through which is written an oxygen precipitate pattern which is fixed the moment the wafer is loaded into the furnace.

After oxygen precipitation heat-treatment step $S_4$ (e.g., annealing the wafer at a temperature of 800° C. for four hours and then at a temperature of 1000° C. for sixteen hours in an oxygen containing atmosphere), the resulting depth distribution of oxygen precipitates in the wafer is characterized by clear regions of oxygen precipitate-free material (denuded zones) 15 and 15' extending from the front surface 3 and back surface 5 to a depth t, t', respectively. Between these oxygen precipitate-free regions, is a region 17 containing a substantially uniform density of oxygen precipitates.

The concentration of oxygen precipitates in region 17 is primarily a function of the heating step and secondarily a function of the cooling rate. In general, the concentration of oxygen precipitates increases with increasing temperature and increasing annealing times in the heating step with precipitate densities in the range of about $1 \times 10^7$ to about $5 \times 10^{10}$ precipitates/cm$^3$ being routinely obtained.

The depth t, t' from the front and back surfaces, respectively, of oxygen precipitate-free material (denuded) zones 15 and 15' is primarily a function of the cooling rate through the temperature range at which crystal lattice vacancies are relatively mobile in silicon. In general, the depth t, t' decreases with decreasing cooling rates with denuded zone depths of at least about 20, 30, 40, 50, 70 or even 100 micrometers being attainable. Significantly, the depth of the denuded zone is essentially independent of the details of the electronic device manufacturing process and, in addition, does not depend upon the out-diffusion of oxygen as is conventionally practiced. While the heat treatments employed in this process may result in the out-diffusion of a small amount of oxygen from the surface of the front and back surfaces of the wafer, the wafer bulk at depths of at least 5 micrometers from the wafer surface will have a substantially uniform oxygen concentration. Nevertheless, a denuded zone of substantially greater depth can be formed as a consequence of the cooling step which caused the formation of a non-uniform distribution of crystal lattice vacancies in the wafer.

Unlike prior methods used to form denuded zones, it is unnecessary to subject the single crystal silicon to a high temperature step to cause the outdiffusion of oxygen in regions near the surface of the silicon. Such high temperature steps when carried out for the sole purpose of forming a denuded zone add significant cost to the silicon wafer. Thus, the wafer of the present invention will have a denuded zone and a substantially uniform oxygen concentration as a function of depth from the silicon surface. For example, the wafer will have a uniform concentration of oxygen from the center of the wafer to regions of the wafer which are within about 15 microns of the silicon surface, more preferably from the center of the silicon to regions of the wafer which are within about 10 microns of the silicon surface, even more preferably from the center of the silicon to regions of the wafer which are within about 5 microns of the silicon surface and most preferably from the center of the silicon to regions of the wafer which are within 3 microns of the silicon surface. In this context, substantially uniform oxygen concentration shall mean a variance in the oxygen concentration of no more than about 50%, preferably no more than about 20% and most preferably no more than about 10%.

In a second embodiment of the present invention, a non-nitriding atmosphere is used instead of the nitriding atmosphere used in the heating (rapid thermal annealing) and cooling steps of the first embodiment. Suitable non-nitriding atmospheres include argon, helium, neon, carbon dioxide, and other such non-oxidizing, non-nitriding elemental and compound gases.

When argon is used as the atmosphere in the heating (rapid thermal annealing) step, the increase in vacancy concentration throughout the wafer is achieved nearly, if not immediately, upon achieving the annealing temperature. Maintaining the wafer at an established temperature for additional time does not appear, based upon experimental evidence obtained to-date, to lead to an increase in vacancy concentration. This behavior is different from what has been observed when a nitriding atmosphere is used; in nitriding atmospheres, vacancy concentration appears to increase as a function of time at an established annealing temperature. Another difference observed when argon is used is the profile of the resulting vacancy concentration (number density); when the atmosphere is argon the resulting profile is relatively constant from the front to the back of the wafer whereas the resulting profile is "U-shaped" when a nitriding atmosphere is used.

Experimental evidence obtained to-date further suggests that oxide layer 9 may not be required for all applications in which argon or other non-nitriding atmospheres are used for the heating (rapid thermal annealing) step. That is, for these applications a silicon surface having no more than a native oxide may serve as an effective sink for crystal lattice vacancies. Depending upon the atmosphere employed during the rapid thermal annealing step and the desired oxygen precipitation profile of the wafer, therefore, the modified surface layer be formed omitted or formed only upon the side of the wafer at which the denuded zone is desired, i.e., front surface 3 of the wafer (see FIG. 1). Optionally, therefore, back surface 5 of wafer 1 may be shielded during the formation of modified layer 9 to produce a wafer having a modified layer at the surface of the front surface 3, but not the back surface 5 of the wafer.

The starting material may be a polished silicon wafer, or alternatively, a silicon wafer which has been lapped and etched, but not polished. If an epitaxial layer is to be deposited upon the wafer, the process of the present invention may be carried out either before or after the epitaxial deposition. If carried out before, it may be desirable to stabilize the oxygen precipitate nucleation centers in the wafer after the process of the present invention and before the epitaxial deposition. If carried out after, it may be desirable to carry out the process of the present invention in the epitaxial reactor immediately after the epitaxial deposition, provided the cooling rates required by the process of the present invention can be achieved.

The measurement of crystal lattice vacancies in single crystal silicon can be carried out by platinum diffusion analysis. In general, platinum is deposited on the samples and diffused in a horizontal surface with the diffusion time and temperature preferably being selected such that, the Frank-Turnbull mechanism dominates the platinum diffusion, but which is sufficient to reach the steady-state of vacancy decoration by platinum atoms. For wafers having vacancy concentrations which are typical for the present invention, a diffusion time and temperature of 730° C. for 20 minutes would be suitable. In addition, to minimize a possible influence by silicidation processes, the platinum deposition method preferably results in a surface concentration of less than one monolayer. Platinum diffusion techniques are described elsewhere, for example, by Zimmermann and Ryssel, "The Modeling of Platinum Diffusion In Silicon Under Non-Equilibrium Conditions," *J. Electrochemical Society*, vol. 139, p. 256 (1992); Zimmermann, Goesele, Seilenthal and Eichiner, "Vacancy Concentration Wafer Mapping In Silicon," *Journal of Crystal Growth*, vol. 129, p. 582 (1993); Zimmermann and Falster, "Investigation Of The Nucleation of Oxygen Precipitates in Czochralski Silicon At An Early Stage," *Appl. Phys. Lett.*, vol. 60, p. 3250 (1992); and Zimmermann and Ryssel, *Appl. Phys. A*, vol. 55, p. 121 (1992).

The following examples will illustrate the invention.

EXAMPLE 1

Silicon single crystals were pulled by the Czochralski method, sliced and polished to form silicon wafers. These wafers were then subjected to a surface oxidation step ($S_1$), rapid thermal annealing step in nitrogen or argon ($S_2$), rapidly cooled ($S_3$), and subjected to an oxygen stabilization and growth step ($S_4$) under the conditions set forth in Table I. The initial oxygen concentration of the wafers ($O_i$) before steps $S_1$–$S_4$, the oxygen precipitate density in the bulk of the wafers after step $S_4$ (OPD), and the depth of the denuded zone after step $S_4$ (DZ) are also reported in Table I.

TABLE I

| Sample | 4-7 | 4-8 | 3-14 |
|---|---|---|---|
| $S_1$ | 15 min at 1,000° C. in $O_2$ | 15 min at 1,000° C. in $O_2$ | none |
| $S_2$ | 35 seconds at 1250° C. in $N_2$ | 35 seconds at 1250° C. in Ar | 35 seconds at 1250° C. in Ar |
| $S_3$ | 100° C./sec | 100° C./sec | 100° C./sec |
| $S_4$ | 4 hr at 800° C. + 16 hr at 1,000° C. in $N_2$ | 4 hr at 800° C. + 16 hr at 1,000° C. in $N_2$ | 4 hr at 800° C. + 16 hr at 1,000° C. in $N_2$ |
| $O_i$ (atoms/cm$^3$) | $7 \times 10^{17}$ | $6.67 \times 10^{17}$ | $7.2 \times 10^{17}$ |
| OPD (atoms/cm$^3$) | $1 \times 10^{10}$ | $4.4 \times 10^9$ | $1.69 \times 10^{10}$ |
| DZ (depth in μm) | 70 | 95 | 0 |

Figure 2:
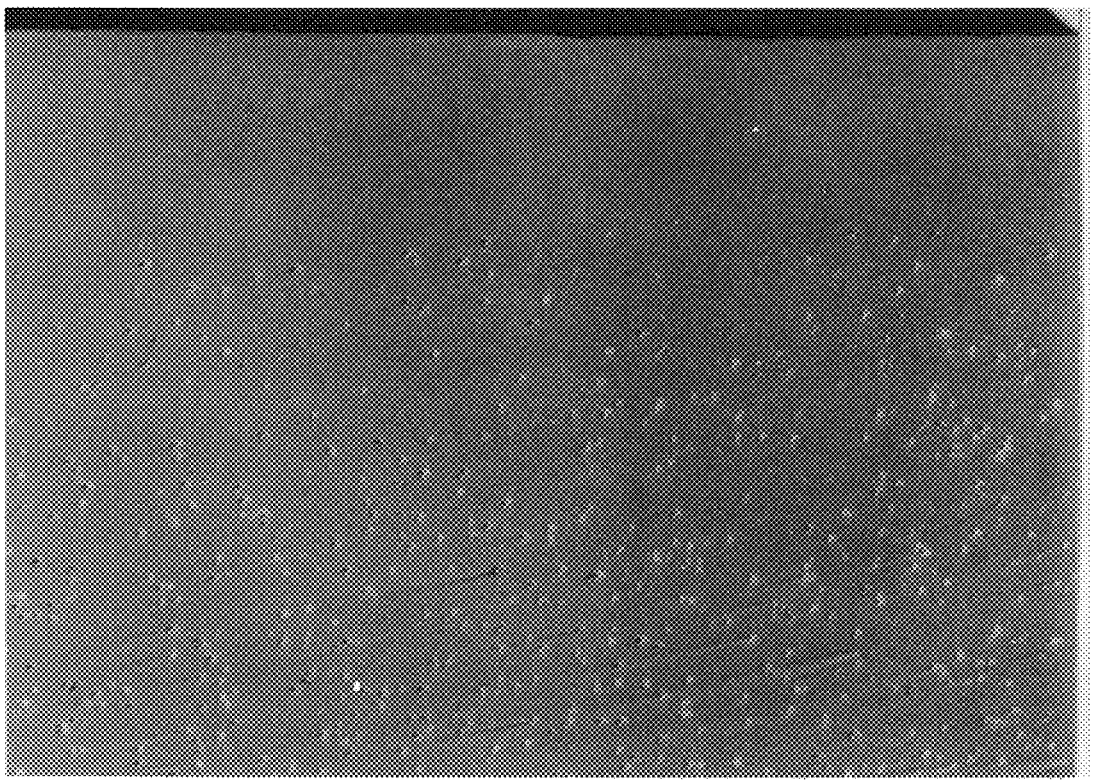
FIG. 2 is a photograph of a cross-section of a wafer (sample 4–7) which was processed as described in Example 1.
Figure 3:
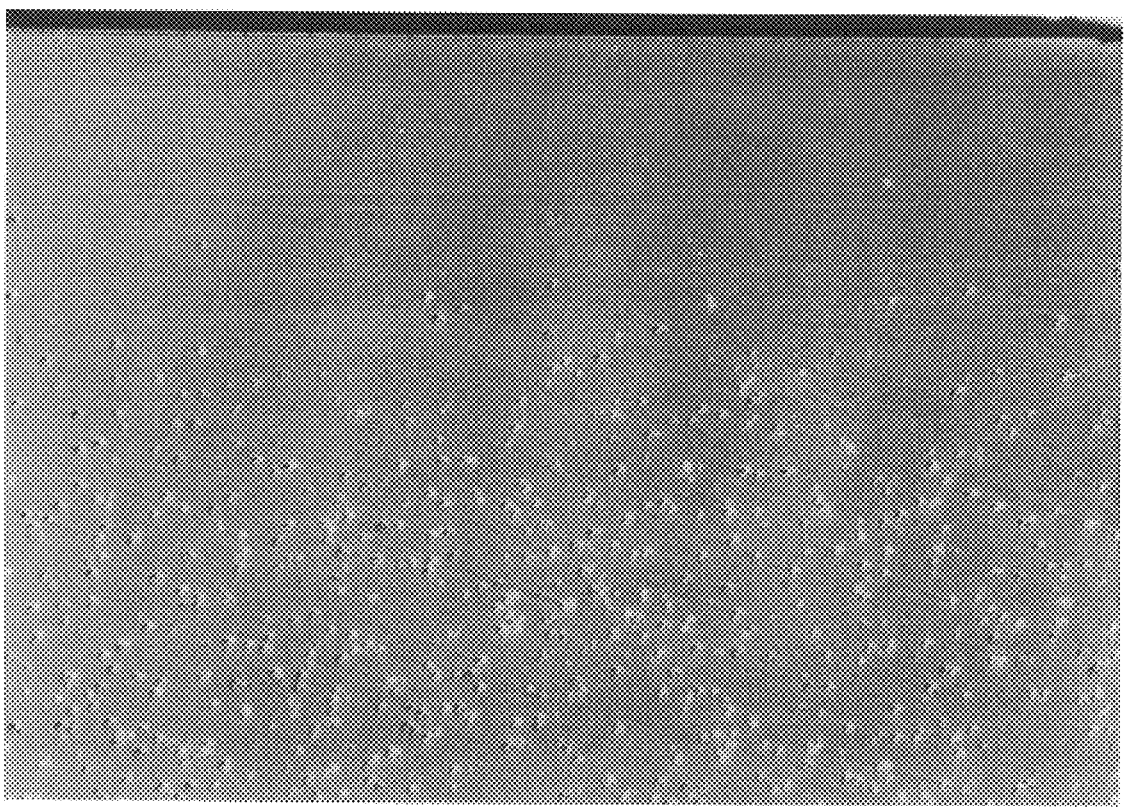
FIG. 3 is a photograph of a cross-section of a wafer (sample 4–8) which was subjected to the series of steps described in Example 1.
Figure 4:
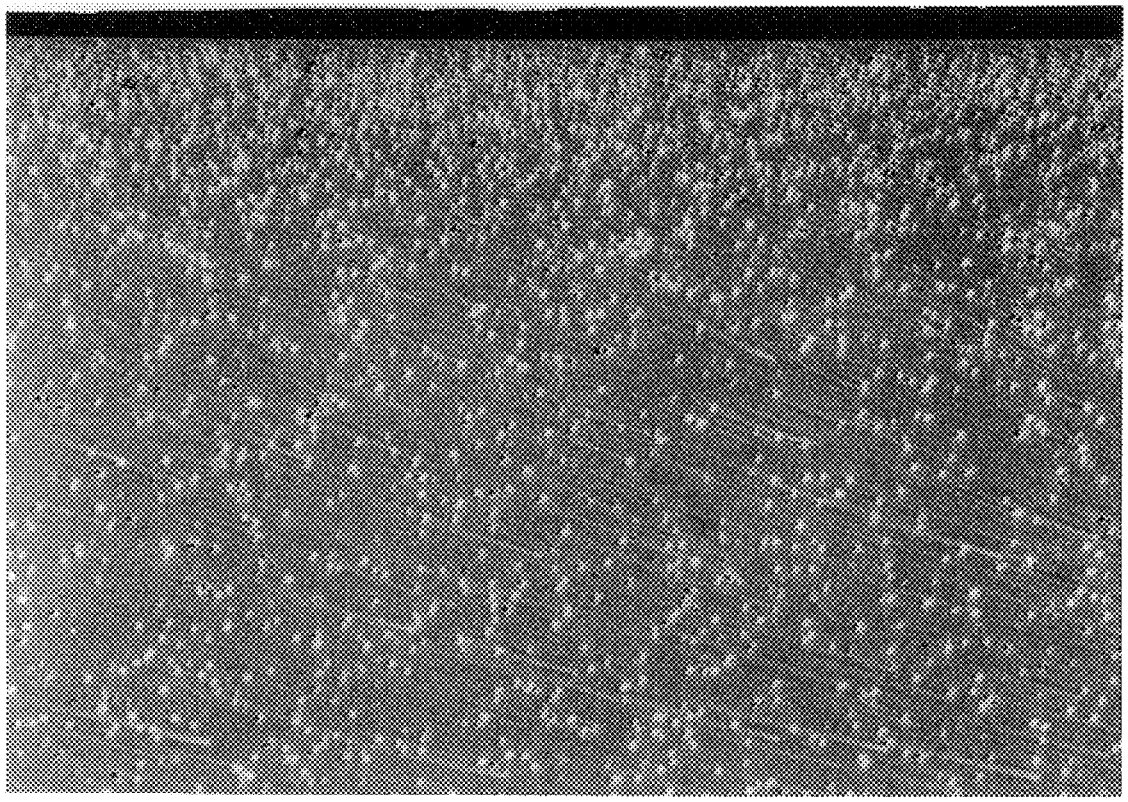
FIG. 4 is a photograph of a cross-section of a wafer (sample 3–14) which was subjected to the series of steps described in Example 1.

FIGS. 2, 3, and 4 are photographs of cross-sections of the resulting wafers at a magnification of 200×; with sample 4–7 being shown in FIG. 2, sample 4–8 being shown in FIG. 3, and sample 3–14 being shown in FIG. 4.

Figure 5:
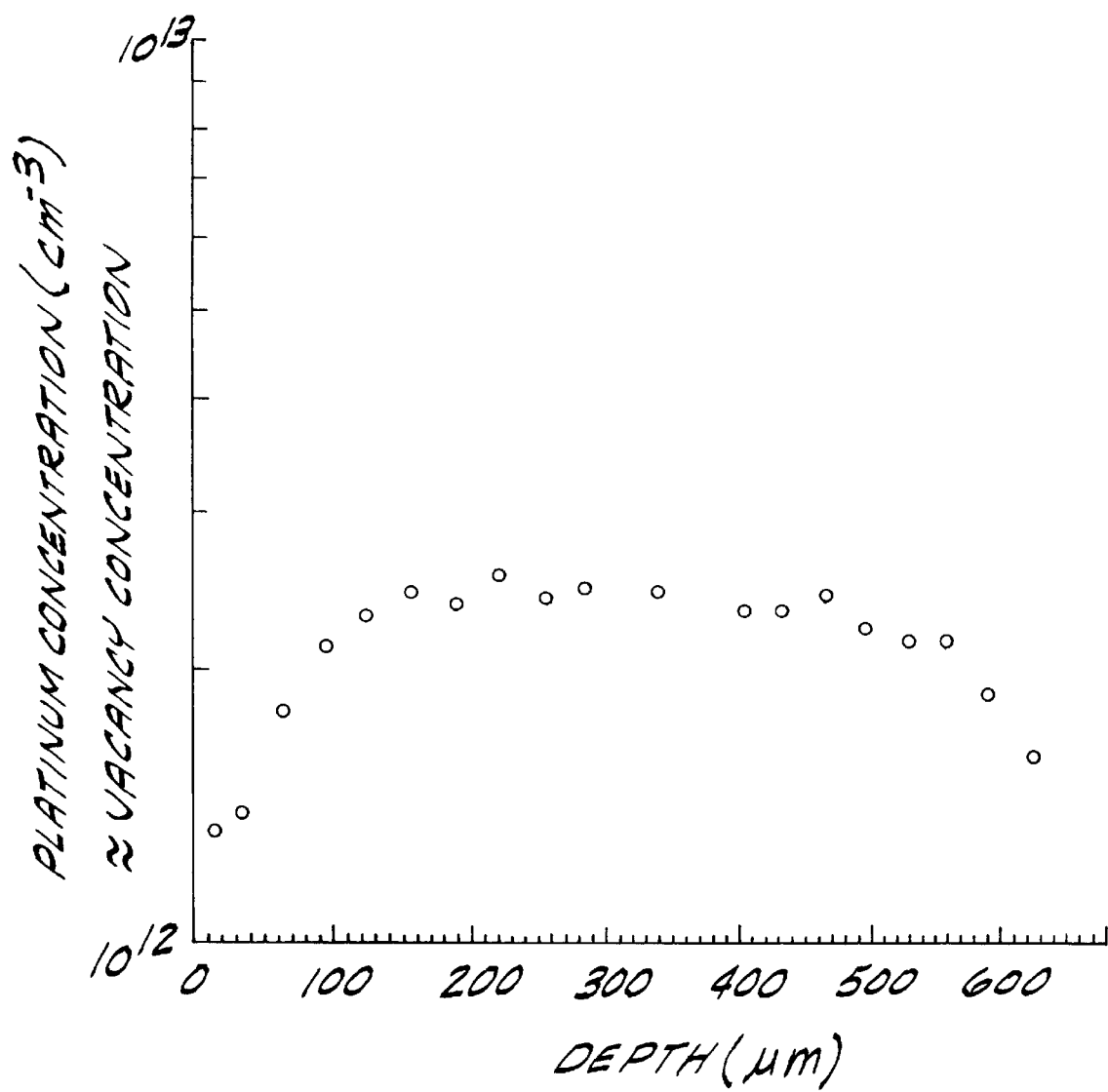
FIG. 5 is a graph of the log of platinum concentration (atoms/cm$^3$) versus depth from the surface of a wafer (sample 4–7) which was subjected to the series of steps set forth in Example 1.

In addition, the concentration of crystal lattice vacancies in the sample 4–7 was mapped using a platinum diffusion technique. A plot of platinum concentration versus depth from the surface of the wafer (a depth of 0 micrometers corresponding to the front side of the wafer) appears in FIG. 5.

EXAMPLE 2

Figure 6:
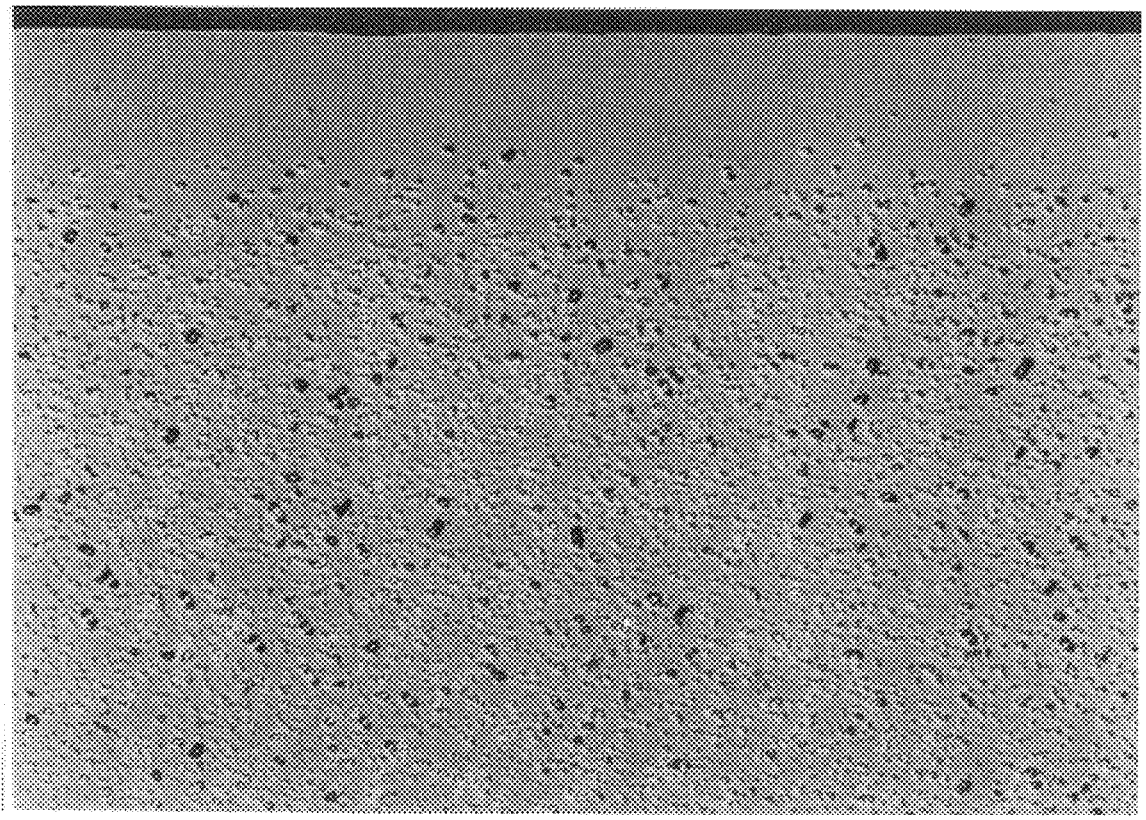
FIG. 6 is a photograph of a cross-section of a wafer (sample 3–4) which was subjected to the series of steps set forth in Example 2.
Figure 7:
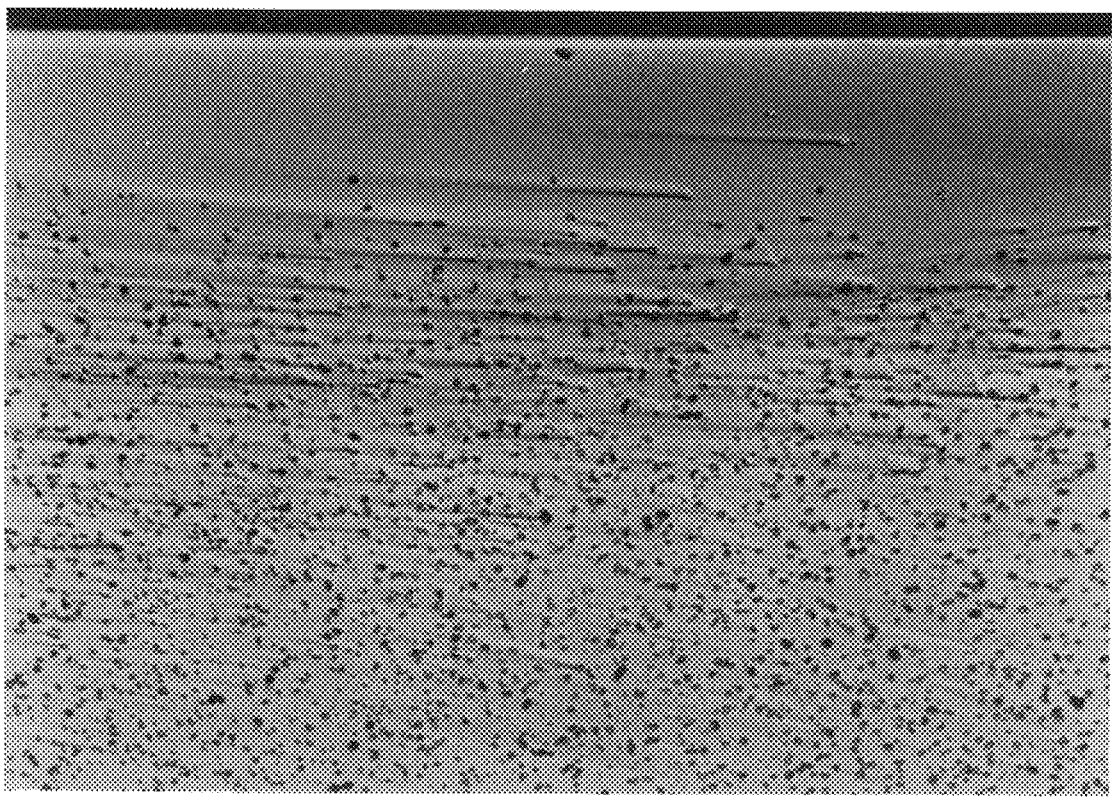
FIG. 7 is a photograph of a cross-section of a wafer (sample 3–5) which was subjected to the series of steps set forth in Example 2.
Figure 8:
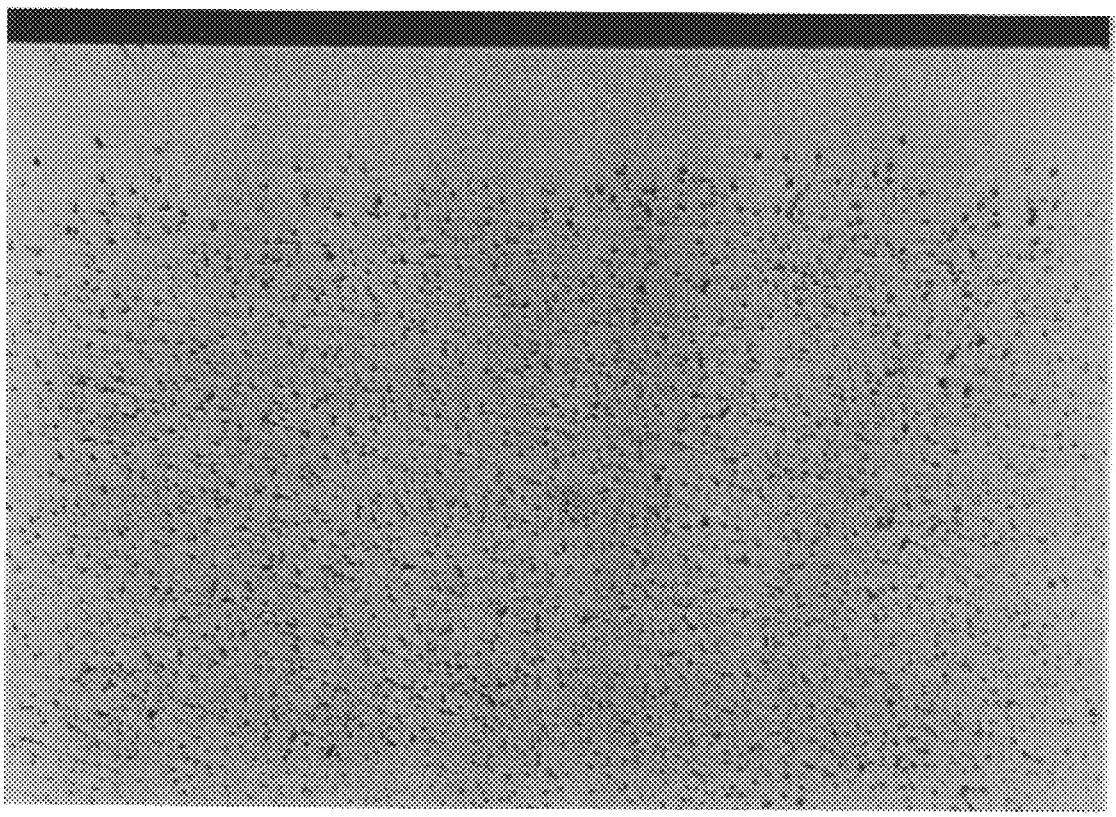
FIG. 8 is a photograph of a cross-section of a wafer (sample 3–6) which was subjected to the series of steps set forth in Example 2.

To demonstrate that the process of the present invention is relatively independent of oxygen concentration for Czochralski-grown silicon wafers, three wafers having different oxygen concentrations were subjected to the same series of steps described in Example 1. The conditions for each of these steps, the initial oxygen concentration of the wafers ($O_i$) before steps $S_1$–$S_4$, the oxygen precipitate density (OPD) in the bulk of the wafers after step $S_4$, and the depth of the denuded zone (DZ) after step $S_4$ as measured from the surface of the wafer are reported in Table I. FIGS. 6, 7, and 8 are photographs of cross-sections of the resulting wafers at a magnification of 200×; with sample 3–4 being shown in FIG. 6, sample 3–5 being shown in FIG. 7, and sample 3–6 being shown in FIG. 8.

TABLE II

| Sample | 3-4 | 3-5 | 3-6 |
|---|---|---|---|
| $S_1$ | 15 min at 1,000° C. in $O_2$ | 15 min at 1,000° C. in $O_2$ | 15 min at 1,000° C. in $O_2$ |
| $S_2$ | 35 seconds at 1250° C. in $N_2$ | 35 seconds at 1250° C. in $N_2$ | 35 seconds at 1250° C. in $N_2$ |
| $S_3$ | 125° C./sec | 125° C./sec | 125° C./sec |
| $S_4$ | 4 hr at | 4 hr at | 4 hr at |

TABLE II-continued

| Sample | 3-4 | 3-5 | 3-6 |
|---|---|---|---|
| | 800° C. + 16 hr at 1,000° C. in $N_2$ | 800° C. + 16 hr at 1,000° C. in $N_2$ | 800° C. + 16 hr at 1,000° C. in $N_2$ |
| $O_i$ (atoms/cm$^3$) | $6 \times 10^{17}$ | $7 \times 10^{17}$ | $8 \times 10^{17}$ |
| OPD (atoms/cm$^3$) | $4 \times 10^{10}$ | $1.33\ 10^{10}$ | $6 \times 10^{11}$ |
| DZ (depth in $\mu$m) | ~40 | ~40 | ~40 |

EXAMPLE 3

Figure 9:
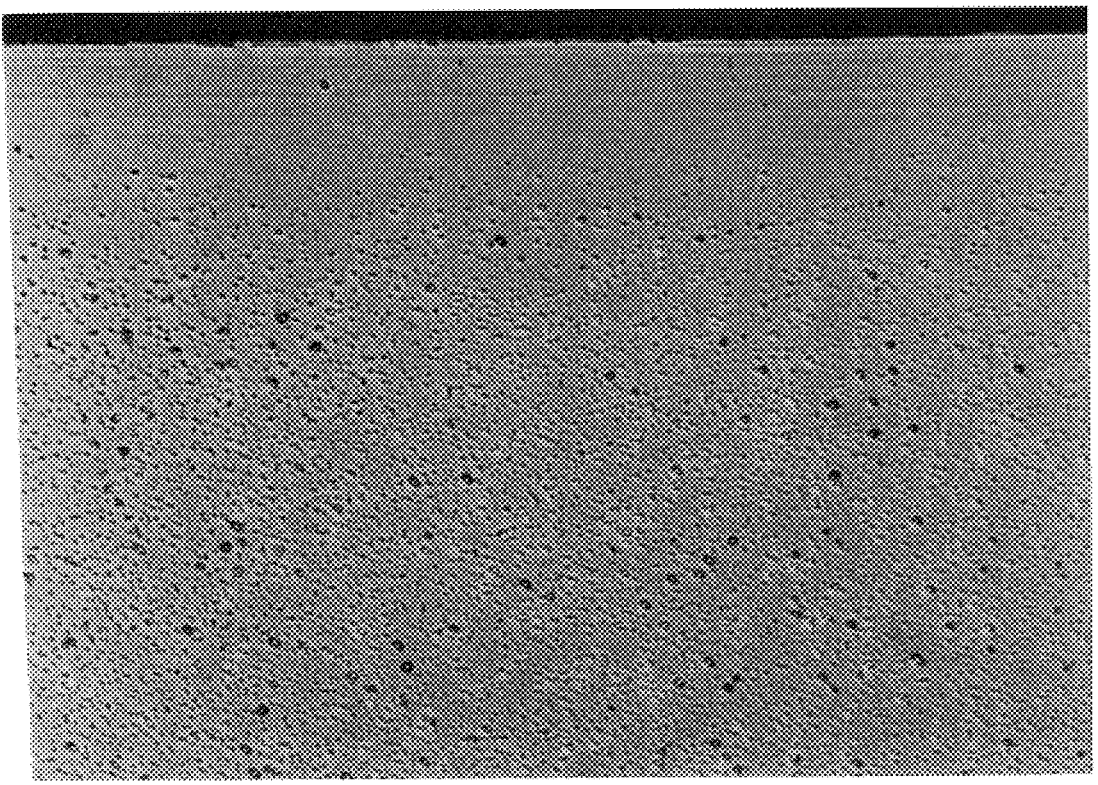
FIG. 9 is a photograph of a cross-section of a wafer (sample 1–8) which was subjected to the series of steps set forth in Example 3.

To demonstrate that the process of the present invention was relatively independent of the conditions used for the oxygen precipitate stabilization and growth step ($S_4$), a wafer (sample 1–8) having the same initial oxygen concentration was subjected to the same series of steps described in Example 2 for sample 3–4 except that a proprietary, commercial 16 M DRAM process was used as the oxygen precipitate stabilization and growth step ($S_4$). FIG. 9 is a photograph of the cross-section of the resulting wafer at a magnification of 200×. After step $S_4$, samples 1–8 and 3–4 had comparable bulk oxygen precipitate densities ($7 \times 10^{10}$/cm$^3$ for sample 1–8 versus ($4 \times 10^{10}$/cm$^3$ for sample 3–4) and comparable denuded zone depths (approximately 40 micrometers).

In view of the above, it will be seen that the several objects of the invention are achieved.

As various changes could be made in the above compositions and processes without departing from the scope of the invention, it is intended that all matter contained in the above description be interpreted as illustrative and not in a limiting sense.

We claim:

1. A wafer sliced from a single crystal silicon ingot grown by the Czochralski method comprising a front surface, a back surface, a central plane between the front and back surfaces, a front surface layer which comprises a first region of the wafer between the front surface and a distance, $D_1$, measured from the front surface and toward the central plane, and a bulk layer which comprises a second region of the wafer between the central plane and the first region; and a non-uniform distribution of crystal lattice vacancies with the concentration of vacancies in the bulk layer being greater than the concentration of vacancies in the front surface layer with the vacancies having a concentration profile in which the peak density of the vacancies is at or near the central plane with the concentration generally decreasing in the direction of the front surface of the wafer.

2. The wafer of claim 1 wherein $D_1$ is at least about 20 micrometers.

3. The wafer of claim 1 wherein $D_1$ is at least about 30 micrometers.

4. The wafer of claim 1 wherein $D_1$ is at least about 50 micrometers.

5. The wafer of claim 1 wherein $D_1$ is at least about 70 micrometers.

6. The wafer of claim 1 wherein $D_1$ is between about 30 and about 100 micrometers.

7. The wafer of claim 1 having a carbon concentration which is less than about $5 \times 10^{16}$ atoms/cm$^3$.

8. The wafer of claim 1 having a carbon concentration which is less than about $1 \times 10^{16}$ atoms/cm$^3$.

9. The wafer of claim 1 having a carbon concentration which is less than about $5 \times 10^{15}$ atoms/cm$^3$.

10. The wafer of claim 1 having an epitaxial layer deposited upon the front surface.

11. The wafer of claim 1 wherein the front surface is polished.

12. The wafer of claim 1 wherein the wafer has an absence of oxygen precipitate nucleation centers which are incapable of being dissolved by heat-treating the wafer at a temperature not in excess of 1300° C.

13. The wafer of claim 12 having a carbon concentration which is less than about $5 \times 10^{15}$ atoms/cm$^3$.

14. The wafer of claim 13 wherein the wafer comprises an epitaxial layer.

15. The wafer of claim 12 wherein the wafer comprises an epitaxial layer.

16. The wafer of claim 12 wherein $D_1$ is at least about 20 micrometers.

17. The wafer of claim 16 having a carbon concentration which is less than about $5 \times 10^{15}$ atoms/cm$^3$.

18. The wafer of claim 17 wherein the wafer comprises an epitaxial layer.

19. The wafer of claim 16 wherein the wafer comprises an epitaxial layer.

20. The wafer of claim 12 wherein $D_1$ is at least about 30 micrometers.

21. The wafer of claim 20 having a carbon concentration which is less than about $5 \times 10^{15}$ atoms/cm$^3$.

22. The wafer of claim 12 wherein $D_1$ is at least about 50 micrometers.

23. The wafer of claim 22 having a carbon concentration which is less than about $5 \times 10^{15}$ atoms/cm$^3$.

24. The wafer of claim 12 wherein $D_1$ is between about 30 and about 100 micrometers.

25. The wafer of claim 24 having a carbon concentration which is less than about $5 \times 10^{15}$ atoms/cm$^3$.

26. A wafer having a front surface, a back surface, and a central plane between the front and back surfaces, the wafer having a front surface layer consisting of the region of the wafer within a distance, $D_2$, of the front surface wherein $D_2$ is no more than about 15 micrometers and a bulk layer comprising the region of the wafer between the central and plane the front surface layer, the wafer having a substantially uniform oxygen concentration and a concentration of crystal lattice vacancies in the bulk layer such that upon being subjected to an oxygen precipitation heat treatment consisting essentially of annealing the wafers at 800° C. for four hours and then at 1000° C. for sixteen hours, the wafer will contain oxygen precipitates having a concentration profile in which the peak density of the precipitates in the bulk layer is at or near the central plane with the concentration of the precipitates in the bulk layer generally decreasing in the direction of the front surface layer.

27. The wafer of claim 26 wherein $D_2$ is no more than about 10 micrometers.

28. The wafer of claim 26 wherein $D_2$ is no more than about 5 micrometers.

29. The wafer of claim 26 wherein $D_2$ is no more than 3 micrometers.

30. The wafer of claim 26 having a carbon concentration which is less than about $5 \times 10^{15}$ atoms/cm$^3$.

31. The wafer of claim 26 having an epitaxial layer deposited upon the front surface.

32. The wafer of claim 26 wherein the front surface is polished.

33. The wafer of claim 26 wherein the wafer has an absence of oxygen precipitate nucleation centers which are incapable of being dissolved by heat-treating the wafer at a temperature not in excess of 1300° C.

34. The wafer of claim 33 having a carbon concentration which is less than about $5 \times 10^{15}$ atoms/cm$^3$.

35. The wafer of claim 34 having an epitaxial layer deposited upon the front surface.

36. The wafer of claim 33 having an epitaxial layer deposited upon the front surface.

37. A wafer having a front surface, a back surface, and a central plane between the front and back surfaces, the wafer having a front surface layer consisting of the region of the wafer within a distance, $D_2$, of no more than about 15 micrometers, a bulk layer comprising the region of the wafer between the central and plane the front surface layer, and a denuded zone which comprises the front surface layer and a portion of the bulk layer, the wafer being characterized in that it has a substantially uniform oxygen concentration in the bulk layer, oxygen precipitates in the portion of the bulk layer which is outside the denuded zone, and a substantial absence of oxygen precipitates in the denuded zone.

38. The wafer of claim 37 wherein $D_2$ is no more than about 10 micrometers.

39. The wafer of claim 37 wherein $D_2$ is no more than about 5 micrometers.

40. The wafer of claim 37 wherein $D_2$ is no more than 3 micrometers.

41. The wafer of claim 37 wherein the denuded zone extends to a distance of at least about 20 micrometers from the front surface.

42. The wafer of claim 41 wherein $D_2$ is no more than about 10 micrometers.

43. The wafer of claim 41 wherein $D_2$ is no more than about 5 micrometers.

44. The wafer of claim 41 wherein $D_2$ is no more than 3 micrometers.

45. The wafer of claim 37 wherein the denuded zone extends to a distance of at least about 30 micrometers of the front surface.

46. The wafer of claim 45 wherein $D_2$ is no more than about 10 micrometers.

47. The wafer of claim 45 wherein $D_2$ is no more than about 5 micrometers.

48. The wafer of claim 45 wherein $D_2$ is no more than 3 micrometers.

49. The wafer of claim 37 wherein the denuded zone extends to a distance of at least about 50 micrometers of the front surface.

50. The wafer of claim 49 wherein $D_2$ is no more than about 10 micrometers.

51. The wafer of claim 49 wherein $D_2$ is no more than about 5 micrometers.

52. The wafer of claim 18 wherein $D_2$ is no more than 3 micrometers.

53. The wafer of claim 37 wherein the denuded zone extends to a distance of at least about 70 micrometers of the front surface.

54. The wafer of claim 53 wherein $D_2$ is no more than about 10 micrometers.

55. The wafer of claim 53 wherein $D_2$ is no more than about 5 micrometers.

56. The wafer of claim 53 wherein $D_2$ is no more than 3 micrometers.

57. The wafer of claim 37 wherein the denuded zone extends to a distance of at least about 100 micrometers of the front surface.

58. The wafer of claim 57 wherein $D_2$ is no more than about 10 micrometers.

59. The wafer of claim 57 wherein $D_2$ is no more than about 5 micrometers.

60. The wafer of claim 52 wherein $D_2$ is no more than 3 micrometers.

61. The wafer of claim 37 having a carbon concentration which is less than about $5 \times 10^{15}$ atoms/cm$^3$.

62. The wafer of claim 11 having an epitaxial layer deposited upon the front surface.

63. The wafer of claim 37 wherein the front surface is polished.

64. The wafer of claim 37 wherein the wafer has an absence of oxygen precipitate nucleation centers which are incapable of being dissolved by heat-treating the wafer at a temperature not in excess of 1300° C.

65. The wafer of claim 64 having a carbon concentration which is less than about $5 \times 10^{15}$ atoms/cm$^3$.

66. The wafer of claim 65 having an epitaxial layer deposited upon the front surface.

67. The wafer of claim 64 having an epitaxial layer deposited upon the front surface.

* * * * *

UNITED STATES PATENT AND TRADEMARK OFFICE
CERTIFICATE OF CORRECTION

PATENT NO. : 5,994,761
DATED : November 30, 1999
INVENTOR(S) : Robert Falster, Marco Cornara, Daniela Gambaro, Massimiliano Olmo It is certified that error appears in the above-identified patent and that said Letters Patent is hereby corrected as shown below:

In Column 12, Claim 26, lines 44, 45 "central and plane the front" should read -- central plane and the front --.

In Column 13, Claim 37, line 16 "central and plane the front" should read -- central plane and the front --.

In Column 14, Claim 52, line 8 "claim 18" should read -- claim 49 --.

In Column 14, Claim 60, line 27 "claim 52" should read -- claim 57 --.

In Column 14, Claim 62, line 31 "claim 11" should read -- claim 37 --.

Signed and Sealed this

Fourteenth Day of November, 2000

*Attest:*

Q. TODD DICKINSON

*Attesting Officer*      *Director of Patents and Trademarks*